United States Patent
Katsura

(10) Patent No.: US 9,790,575 B2
(45) Date of Patent: *Oct. 17, 2017

(54) ELECTRIC AND ELECTRONIC PART COPPER ALLOY SHEET WITH EXCELLENT BENDING WORKABILITY AND STRESS RELAXATION RESISTANCE

(71) Applicant: Kobe Steel, Ltd., Kobe-shi (JP)

(72) Inventor: Shinya Katsura, Shimonoseki (JP)

(73) Assignee: Kobe Steel, Ltd., Kobe-shi (JP)

( * ) Notice: Subject to any disclaimer, the term of this patent is extended or adjusted under 35 U.S.C. 154(b) by 0 days.

This patent is subject to a terminal disclaimer.

(21) Appl. No.: 14/886,720

(22) Filed: Oct. 19, 2015

(65) Prior Publication Data

US 2016/0040270 A1 Feb. 11, 2016

Related U.S. Application Data

(63) Continuation of application No. 13/798,657, filed on Mar. 13, 2013, now Pat. No. 9,194,026.

(30) Foreign Application Priority Data

Mar. 28, 2012 (JP) .................... 2012-073986

(51) Int. Cl.
  *C22C 9/06* (2006.01)
  *C22F 1/08* (2006.01)
  *C22C 9/04* (2006.01)

(52) U.S. Cl.
  CPC .............. *C22C 9/06* (2013.01); *C22C 9/04* (2013.01); *C22F 1/08* (2013.01); *H01L 2924/0002* (2013.01)

(58) Field of Classification Search
  CPC ..... C22C 9/06; C22C 9/04; C22F 1/08; H01L 2924/0002; H01L 2924/00
  See application file for complete search history.

(56) References Cited

U.S. PATENT DOCUMENTS

| | | |
|---|---|---|
| 6,334,915 B1 | 1/2002 | Ogura et al. |
| 6,379,478 B1 | 4/2002 | Farquharson et al. |
| 8,784,580 B2 | 7/2014 | Fugono et al. |
| 9,194,026 B2 * | 11/2015 | Katsura ............... C22C 9/06 |
| 2005/0028907 A1 | 2/2005 | Hasegawa et al. |
| 2006/0196586 A1 | 9/2006 | Hasegawa et al. |
| 2009/0101243 A1 | 4/2009 | Aruga et al. |
| 2010/0047112 A1 | 2/2010 | Fugono et al. |
| 2010/0193092 A1 | 8/2010 | Matsuo et al. |
| 2010/0269959 A1 | 10/2010 | Gao et al. |
| 2010/0310413 A1 | 12/2010 | Hirose et al. |
| 2012/0148439 A1 | 6/2012 | Shishido et al. |
| 2012/0288402 A1 | 11/2012 | Aruga |

FOREIGN PATENT DOCUMENTS

| | | |
|---|---|---|
| CN | 101605917 | 12/2009 |
| CN | 101680057 | 3/2010 |
| DE | 103 92 428 | 6/2005 |
| EP | 1 264 905 | 12/2002 |
| EP | 2 248 922 | 11/2010 |
| JP | 11-335756 | 12/1999 |
| JP | 2007-146293 | 6/2007 |
| JP | 2008-75152 | 4/2008 |
| JP | 2008-196042 | 8/2008 |
| JP | 2008-266783 | 11/2008 |

* cited by examiner

*Primary Examiner* — Keith Walker
*Assistant Examiner* — John Hevey
(74) *Attorney, Agent, or Firm* — Oblon, McClelland, Maier & Neustadt, L.L.P.

(57) ABSTRACT

An electric and electronic part copper alloy sheet with excellent bending workability and stress relaxation resistance is made from a copper alloy containing 1.5 to 4.0 percent by mass of Ni, Si satisfying a Ni/Si mass ratio of 4.0 to 5.0, 0.01 to 1.3 percent by mass of Sn, and the remainder composed of copper and incidental impurities, wherein the average crystal grain size is 5 to 20 μm, the standard deviation of the crystal grain size satisfies $2\sigma < 10$ μm, and the proportion of the number of particles having a particle diameter of 90 to 300 nm in Ni—Si dispersed particles having a particle diameter of 30 to 300 nm is 20% or more, where the particles are observed in a cross-section defined by a direction perpendicular to a sheet surface and a direction parallel to a rolling direction.

15 Claims, No Drawings

ELECTRIC AND ELECTRONIC PART COPPER ALLOY SHEET WITH EXCELLENT BENDING WORKABILITY AND STRESS RELAXATION RESISTANCE

CROSS REFERENCE TO THE RELATED APPLICATIONS

This application is a continuation of U.S. patent application Ser. No. 13/798,657, filed on Mar. 13, 2013, the text of which is incorporated by reference, and claims priority to Japanese patent application No. 2012-073986, filed on Mar. 28, 2012, the text of which is also incorporated by reference.

BACKGROUND OF THE INVENTION

1. Field of the Invention

The present invention relates to an copper alloy sheet used for electric and electronic parts, e.g., terminal-connectors and relays, materials for semiconductors (lead frames, heat sinks), materials for electric circuits (automobile junction blocks, consumer electric part circuits), and the like.

2. Description of the Related Art

In an automobile field, many electric and electronic parts have become mounted in order to comply with environmental regulation and pursuit the comfortableness and the safety, and narrowing pitches and miniaturization have been required of terminal-connectors, relays, and the like employed. In addition, the same have been required in information communications and consumer-oriented fields. Consequently, materials having higher 0.2% proof stress, electrical conductivity, bending workability, stress relaxation resistance have been required as electric and electronic part copper alloy sheets.

The 0.2% proof stress refers to a force required for inducing 0.2% of plastic deformation of the material. If the 0.2% proof stress is high, it is possible to keep contact while a strong force is applied to a contact point. Furthermore, the same contact pressure can be obtained by a small sheet width or a thin sheet.

The electrical conductivity refers to ease of passing of electricity and is represented by a ratio (% IACS), where the electrical conductivity of pure copper (IACS) is specified to be 100%. The electrical conductivity and the volume resistivity ($\mu\Omega\cdot cm$) are in inverse proportion. In copper alloy whose electrical conductivity is high, the volume resistivity is low, and Joule heat generation can be suppressed.

The bending workability is evaluated by the ratio (R/t) of the minimum bend radius R, at which cracking does not occur, to the sheet thickness t. A material having good bending workability contributes to stabilization of the quality and, in addition, improves the design flexibility in pressing. Severe bending has been performed with a bend line perpendicular to a rolling direction (G.W) previously. However, cases in which bending is performed with a bend line parallel to a rolling direction (B.W.) have increased because of diversification in design technique.

The stress relaxation resistance refers to the durability to a phenomenon in which the contact pressure is reduced with time under a high-temperature environment, that is, stress relaxation. The stress relaxation resistance is indicated by a stress relaxation ratio or a residual stress expressed in "%" after holding under predetermined load stress, temperature, and time conditions. A material having good stress relaxation resistance can be used, for example, in the vicinity of an automobile engine room and, therefore, contributes to improvements in design flexibility and reliability of electric equipment to a great extent.

A Cu—Ni—Si base copper alloy has all of these characteristics and is widely used as electric and electronic part copper alloy sheets at present. The Cu—Ni—Si base alloy is an alloy having increased 0.2% proof stress and electrical conductivity by aging precipitation of a Ni—Si compound from a supersaturated solid solution. In the case where the Cu—Ni—Si base alloy is subjected to a high-temperature short-time heat treatment referred to as a solution treatment, a recrystallized grain structure can be formed. The bending workability of a material having a recrystallized grain structure is considerably improved as compared with the bending workability of a material having a worked structure.

In addition, the Cu—Ni—Si base alloy is a precipitation strengthening alloy and, therefore, can obtain a high 0.2% proof stress while the working strain is kept at a low level as compared with a solution strengthening alloy in the related art. If much working strain is accumulated, dislocation in a material structure is relaxed easily, and the stress relaxation resistance is degraded. That is, the Cu—Ni—Si base alloy is superior to other alloy systems in the stress relaxation resistance as well.

Meanwhile, there is a so-called trade-off relationship in which if any one of the characteristics of the 0.2% proof stress, the electrical conductivity, the bending workability, and the stress relaxation resistance of the above-described Cu—Ni—Si base alloy is further improved, the other characteristics are degraded. Consequently, in many cases, improvements of the characteristics are prevented. It is particularly difficult to ensure compatibility between the bending workability and the stress relaxation resistance because the bending workability becomes good when the crystal grain size is small and the stress relaxation resistance becomes good when the crystal grain size is large. Therefore, there is a previously proposed technique in which the bending workability is improved mainly by controlling the crystal grain size and the stress relaxation resistance is improved mainly by adding an element or elements.

In Japanese Patent Application Publication No. 2008-75152, Japanese Patent Application Publication No. 2008-196042, Japanese Patent Application Publication No. 2008-266783, Japanese Patent Application Publication No. 2007-146293, and Japanese Patent Application Publication No. 11-335756 disclose methods for improving the bending workability or the stress relaxation resistance of Cu—Ni—Si base copper alloys. Among them, Japanese Patent Application Publication No. 2008-75152, Japanese Patent Application Publication No. 2008-196042, and Japanese Patent Application Publication No. 2008-266783 disclose methods for improving the bending workability of the Cu—Ni—Si base copper alloys by controlling the crystal grain sizes. Japanese Patent Application Publication No. 2007-146293 discloses a method for improving the stress relaxation resistance of the Cu—Ni—Si base copper alloy by controlling additional elements. Unexamined Patent Application Publication No. 11-335756 discloses a method for improving the stress relaxation resistance by controlling additional elements and improving the bending workability by controlling the crystal grain size.

As shown in the above-described five patent literatures, the bending workability of the Cu—Ni—Si base alloy has been improved mainly by controlling the crystal grain size and the stress relaxation resistance has been improved mainly by controlling the addition of elements. However, there are problems in that an improvement in bending workability by control of the crystal grain size, specifically, reduction in the crystal grain size, is accompanied by degradation in stress relaxation resistance, and an improvement in stress relaxation resistance by the additional elements is accompanied by degradation in electrical conductivity and bending workability, although not described in the above-described five patent literatures. In addition, in order to obtain predetermined bending workability and stress relaxation resistance, it is required that the crystal grain size falls within a predetermined range through the recrystallization by a solution treatment. However, there is a problem in that crystal grains become coarse sharply in accordance with changes in treatment temperature depending on a desired crystal grain size and variations occur in the characteristics of a product.

SUMMARY OF THE INVENTION

Accordingly, it is an object of the present invention to provide an electric and electronic part copper alloy sheet with excellent bending workability and excellent stress relaxation resistance by using a Cu—Ni—Si base copper alloy.

The present inventors performed experiments on Cu—Ni—Si base copper alloy sheets, where working and heat treatment conditions were changed variously. As a result, it was found that there was a region in which the form of cracking generated in bending changed from transgranular cracking to intergranular cracking along with growth of recrystallized grains. Furthermore, it was found that changes in dimension of recrystallized grain in accordance with changes in solution treatment temperature are different depending on the distribution state of dispersed particles. Consequently, a copper alloy, according to the present invention, with excellent bending workability and stress relaxation resistance was reached by controlling an appropriate crystal grain size stably.

An electric and electronic part copper alloy sheet according to the present invention is made from a copper alloy containing 1.5 to 4.0 percent by mass of Ni, Si satisfying a Ni/Si mass ratio of 4.0 to 5.0, 0.01 to 1.3 percent by mass of Sn, and the remainder composed of copper and incidental impurities, wherein the average crystal grain size is 5 to 20 μm, the standard deviation of the crystal grain size satisfies $2\sigma<10$ μm, and the proportion of the number of particles having a particle diameter of 90 to 300 nm in Ni—Si dispersed particles having a particle diameter of 30 to 300 nm is 20% or more, where the particles are observed in a cross-section defined by a direction perpendicular to a sheet surface and a direction parallel to a rolling direction, and is excellent in bending workability and stress relaxation resistance.

It is desirable that, in the above-described copper alloy sheet, the proportion of the number of particles having a particle diameter of 120 to 300 nm in dispersed particles having a particle diameter of 30 to 300 nm be 30% or more, where the particles are observed in the above-described cross-section, (in the above-described range, the proportion of particles having a large particle diameter is larger). Meanwhile, it is desirable that the average crystal grain size be more than 10 μm and 20 μm or less (in the above-described range, the average crystal grain size be larger).

The above-described copper alloy may contain, as necessary, at least one type of 0.005 to 0.2 percent by mass of Mg and 0.01 to 5.0 percent by mass of Zn, besides Ni, Si, and Sn. In addition, at least one type of 0.01 to 0.5 percent by mass of Mn and 0.001 to 0.3 percent by mass of Cr may be contained, as necessary. It is desirable that the S content in the above-described copper alloy be 0.02 percent by mass or less.

According to the present invention, an electric and electronic part copper alloy sheet with excellent bending workability and stress relaxation resistance can be obtained by using Cu—Ni—Si base copper alloys.

DESCRIPTION OF THE PREFERRED EMBODIMENTS

The alloy composition, the state of crystal grains, the state of Ni—Si dispersed particles, and the manufacturing method of a Cu—Ni—Si base copper alloy sheet according to the present invention will be specifically described below.

<Alloy Composition>

(Ni and Si)

Nickel and Silicon are elements which generate $Ni_2Si$ dispersed particles in a Cu—Ni—Si base copper alloy sheet and which improve the mechanical characteristics of the alloy. The amount of addition of Ni is 1.5 to 4.0 percent by mass, and the amount of addition of Si is specified to be an amount in accordance with the amount of addition of Ni in such a way that a Ni/Si mass ratio becomes 4.0 to 5.0. If the amount of addition of Ni is less than 1.5 percent by mass, the mechanical characteristics are degraded. If the amount of addition of Ni is more than 4.0 percent by mass, Ni or Si is crystallized out or precipitated in casting and the hot workability is degraded. If the Ni/Si mass ratio is less than 4.0 or more than 5.0, excess Ni or Si makes a solid solution, so that the electrical conductivity is degraded. The amount of addition of Ni is desirably 1.7 to 3.6 percent by mass, further desirably 1.7 to 3.4 percent by mass, and still further desirably 1.7 to 2.8 percent by mass.

(Sn)

Tin makes a solid solution with a copper alloy structure and, thereby, improves the mechanical characteristics and the stress relaxation resistance of the copper alloy. For that purpose, addition of 0.01 percent by mass or more is required. On the other hand, if the amount of addition is more than 1.3 percent by mass, the electrical conductivity and the bending workability are degraded. Therefore, the amount of addition of Sn is specified to be 0.01 to 1.3 percent by mass. The amount of addition of Sn is desirably 0.01 to 0.6 percent by mass, and further desirably 0.01 to 0.3 percent by mass.

(Mg)

Magnesium makes a solid solution with a copper alloy structure and, thereby, improves the mechanical characteristics and the stress relaxation resistance of the copper alloy. For that purpose, addition of 0.005 percent by mass or more is required. On the other hand, if the amount of addition is more than 0.2 percent by mass, the bending workability and the electrical conductivity are degraded. Therefore, the amount of addition of Mg is specified to be 0.005 to 0.2 percent by mass. The amount of addition of Mg is desirably 0.005 to 0.15 percent by mass, and further desirably 0.005 to 0.05 percent by mass.

(Zn)

Zinc improves the Sn plating releasability of the copper alloy. For that purpose, addition of 0.01 percent by mass or more is required. On the other hand, if the amount of addition is more than 5 percent by mass, the electrical conductivity is degraded. Therefore, the amount of addition of Zn is specified to be 0.01 to 5 percent by mass. The amount of addition of Zn is desirably 0.01 to 2 percent by mass, and further desirably 0.01 to 1.2 percent by mass.

(Cr)

Chromium improves the hot workability of the copper alloy. For that purpose, addition of 0.001 percent by mass or more is required. On the other hand, if the amount of addition is more than 0.3 percent by mass, crystallized-out materials are generated and, thereby, the bending workability is degraded. Therefore, the amount of addition of Cr is specified to be 0.001 to 0.3 percent by mass. The amount of addition of Cr is desirably 0.001 to 0.1 percent by mass.

(Mn)

Manganese also improves the hot workability of the copper alloy. For that purpose, addition of 0.01 percent by mass or more is required. On the other hand, if the amount of addition is more than 0.5 percent by mass, the electrical conductivity is degraded. Therefore, the amount of addition of Mn is specified to be 0.01 to 0.5 percent by mass. The amount of addition of Mn is desirably 0.01 to 0.3 percent by mass.

(S)

Sulfur forms a compound with other solid solution elements and, thereby, degrade the stress relaxation resistance and the bending workability. Therefore, the S content as an incidental impurity is desirably 0.02 percent by mass or less, further desirably 0.01 percent by mass or less, further desirably 0.005 percent by mass or less, and still further desirably 0.002 percent by mass or less.

<State of Crystal Grains>

In general, the bending workability required of the electric and electronic part copper alloy sheet becomes better as the average crystal grain size is reduced. This is because the grain boundary area is reduced and segregation of solid solution elements and stress concentration occur easily at crystal grain boundaries as the crystal grain size increases. When the degree of stress concentration exceeds a certain level, cracking occurs from crystal grain boundaries of the copper alloy, and intergranular cracking is reached. On the other hand, in the case where the degree of stress concentration on crystal grain boundaries is at a low level, slip occurs in a crystal grain, and in the case of severe bending, transgranular cracking is reached. Usually, intergranular cracking has high susceptibility to cracking due to bending as compared with transgranular cracking.

Specifically, in the Cu—Ni—Si base alloy sheet according to the present invention, when the average crystal grain size is 20 μm or less, the form of cracking is transgranular cracking, and when the average crystal grain size is more than 20 μm, the form of cracking is intergranular cracking. In this regard, even when the average crystal grain size is 20 μm or less, in the case where particles having large particle diameters are present partly, intergranular cracking is reached. Consequently, it is necessary to reduce variations in average crystal grain size, that is, the standard deviation 2σ of the crystal grain size. In the Cu—Ni—Si base alloy sheet, intergranular cracking can be suppressed by specifying the standard deviation 2σ of the crystal grain size to be less than 10.

Meanwhile, the stress relaxation resistance required of the copper alloy sheet is improved as the average crystal grain size increases. In order to obtain good stress relaxation resistance suitable for an electric and electronic part copper alloy sheet, it is necessary that the average crystal grain size is 5 μm or more.

In consideration of the above-described influences of the crystal grain size on the bending workability and the stress relaxation resistance of the copper alloy sheet, in order to allow the copper alloy sheet to have both the above-described characteristics, it is desirable that the average crystal grain size of the copper alloy sheet be within the range in which intergranular cracking can be suppressed and the crystal grain size be maximized within that range. That is, the average crystal grain size is 5 to 20 μm and the standard deviation 2σ of the crystal grain size is less than 10. The average crystal grain size is within the range of desirably 7 to 20 μm, and further desirably more than 10 μm.

<State of Ni—Si Dispersed Particles>

The present inventors examined the bending workability and the stress relaxation resistance of a Cu—Ni—Si base copper alloy sheet subjected to a Ni—Si particle precipitation treatment before a recrystallization treatment accompanied by a solution treatment (refer to a manufacturing method described later). As a result, it was made clear that in the copper alloy sheet having these characteristics satisfying desired values, many Ni—Si particles having a particle diameter of 30 to 300 nm were precipitated (within the range of about 50 to 500 particles/100 $\mu m^2$), and among them, the proportion of the number of particles having a particle diameter of 90 nm or more was 20% or more. In the copper alloy sheet with particularly excellent bending workability and stress relaxation resistance, the proportion of the number of particles having a particle diameter of 120 nm or more was 30% or more in Ni—Si dispersed particles having a particle diameter of 30 to 300 nm.

In recrystallization treatment accompanied by a solution treatment, growth of recrystallized grains is controlled by sustaining the Ni—Si dispersed particles having a particle diameter of 30 to 300 nm remain in a base material after the recrystallization treatment accompanied by a solution treatment. In the case where the proportion of the number of particles having a particle diameter of 90 nm or more in Ni—Si dispersed particles having a particle diameter of 30 to 300 nm is 20% or more or the proportion of the number of particles having a particle diameter of 120 nm or more is 30% or more, a phenomenon in which, in recrystallization treatment accompanied by a solution treatment, the growth rate increases sharply, when recrystallized grains are grown and exceed a predetermined dimension, is relaxed, so that the grain size and the standard deviation of the recrystallized grains are controlled easily.

<Manufacturing Method>

A previously employed standard method for manufacturing a Cu—Ni—Si base copper alloy sheet having the composition according to the present invention includes melting and casting→soaking treatment→hot rolling→quenching after hot rolling→cold rolling→recrystallization treatment accompanied by solution treatment→cold rolling→aging treatment. In addition, the steps performed in the order of aging treatment→cold rolling after the recrystallization treatment accompanied by a solution treatment is effective for enhancing strength. Furthermore, in order to obtain a better spring property, low-temperature annealing may be performed finally.

Meanwhile, in order to obtain the copper alloy sheet according to the present invention, it is necessary to perform precipitation treatment of Ni—Si dispersed particles at a stage before the recrystallization treatment accompanied by a solution treatment. Specifically, besides the individual steps of the previously employed standard manufacturing method described above, at least one precipitation step to precipitate Ni—Si dispersed particles may be added at an appropriate stage after start of the hot rolling and before the solution treatment accompanied by recrystallization.

Precipitates generated in the aging treatment after the solution treatment are fine and, in general, particle diameters are several nanometers to 20 nm. On the other hand, crystallized-out materials are coarse and, in general, most of them have particle diameters of more than 1,000 nm. Therefore, all or most of Ni—Si dispersed particles which are observed in the final copper alloy sheet and which have particle diameters of 30 to 300 nm are precipitated in the precipitation step before the recrystallization treatment accompanied by a solution treatment.

Each of the steps of the above-described manufacturing method will be described in more detail.

(Soaking Treatment and Hot Rolling)

The soaking treatment is performed under the condition of holding at a temperature of 850° C. to 1,000° C. for 0.2 to 16 hours. Subsequently, the hot rolling is performed.

(Precipitation Treatment of Ni—Si Dispersed Particles)

In the precipitation treatment, for example, (1) hot rolling is finished at 700° C. or higher and, thereafter, slow cooling from 700° C. to 200° C. is performed at an average cooling rate of 100° C./hr or less or (2) hot rolling is finished at 700° C. or higher, water cooling (the rate of cooling to 300° C. is specified to be 400° C./min or more) is performed and, thereafter, heating is performed at a temperature of higher than 500° C. and 700° C. or lower, desirably higher than 550° C. and 700° C. or lower, and further desirably higher than 600° C. and 700° C. or lower for 1 minute to 20 hours before the recrystallization treatment accompanied by a solution treatment is performed. In either case, Ni—Si dispersed particles remaining after the recrystallization treatment accompanied by a solution treatment are precipitated by this precipitation treatment.

In order to achieve the crystal grain structure and the Ni—Si dispersion state according to the present invention, it is desirable that, in this precipitation treatment step, Ni—Si dispersed particles be precipitated into the base material uniformly. In the case where the method of the above-described item (2) is employed, it is desirable that the rate of temperature raising to a temperature of 500° C. or higher and 700° C. or lower be constant.

(Cold Rolling)

A copper alloy sheet having a predetermined sheet thickness by this cold rolling is subjected to the recrystallization treatment accompanied by a solution treatment at that sheet thickness. The sheet thickness of the recrystallization treatment accompanied by a solution treatment is determined on the basis of the product sheet thickness and a cold rolling reduction ratio after the recrystallization treatment accompanied by a solution treatment. This cold rolling may be performed before or after the above-described precipitation treatment.

(Recrystallization Treatment Accompanied by Solution Treatment)

The purposes of the recrystallization treatment accompanied by a solution treatment are to dissolve Ni and Si as a solid solution at a stage before the aging treatment and form a recrystallization structure having good bending workability and stress relaxation resistance. The favorable condition of the recrystallization treatment accompanied by a solution treatment is influenced by the Ni and Si contents in the copper alloy and the precipitation condition of the upstream step. In the case where the Ni and Si contents are small, a lower temperature is favorable, and in the case where the Ni and Si contents are large, a higher temperature is favorable. Meanwhile, when the precipitation condition is a long time, a high temperature is favorable, and when the precipitation condition is a short time, a low temperature is favorable. Specifically, selection may be performed from the condition of holding at a temperature of 700° C. to 900° C. for 5 to 300 seconds. In this recrystallization treatment accompanied by a solution treatment, Ni—Si dispersed particles which have been precipitated exert a pinning effect during the recrystallization treatment and remain after the recrystallization treatment. As the condition of the recrystallization treatment accompanied by a solution treatment becomes a low temperature or a short time, the average crystal grain size becomes small and the bending workability is improved. Conversely, as the condition becomes a high temperature or a long time, the amount of solid solution of Ni and Si increases so as to enhance the strength characteristics of a product sheet, and the average crystal grain size increases so as to improve the stress relaxation resistance.

(Cold Rolling)

The cold rolling after the recrystallization treatment accompanied by a solution treatment is performed under the condition of the reduction ratio of 10% to 50%. Nucleation sites of precipitates are introduced by the cold rolling. If the cold rolling reduction ratio is more than 50%, the bending workability is degraded.

(Precipitation Treatment)

The precipitation treatment is performed at 350° C. to 500° C. for 30 minutes to 24 hours. If the holding temperature is lower than 350° C., precipitation of $Ni_2Si$ becomes insufficient. If the holding temperature is higher than 500° C., the strength of the copper alloy sheet is reduced, and required strength characteristics is not obtained. Meanwhile, if the holding time is less than 30 minutes, precipitation of $Ni_2Si$ becomes insufficient, and if the holding time is more than 24 hours, the productivity is impaired.

In the manufacturing method described above, the cold rolling and the recrystallization treatment accompanied by a solution treatment may be performed repeatedly after the hot rolling, final cold rolling may be performed after the aging treatment, or low-temperature annealing may be performed as a final step. In the case where cold rolling is performed after the aging treatment, it is desirable that a total of the reduction ratio thereof and the reduction ratio of the cold rolling before the aging treatment be 50% or less.

EXAMPLES

Copper alloys having compositions of Nos. 1 to 5 shown in Tables 1 and 2 were melted and cast with a kryptol furnace in the air under coverage by charcoal. An ingot was subjected to a soaking treatment under the condition of 800° C. to 1,000° C. for 1 to 3 hours and, subsequently, hot rolling was finished at 700° C. or higher. Then, Nos. 1 to 28 and 33 to 48 were water-cooled promptly. Nos. 29 to 32 were quenched at an average cooling rate of 100° C./hr or less. Nos. 49 and 50 were quenched to 500° C. at a cooling rate of 50° C./min, were held at 500° C. for 2 hours, and were water-cooled to room temperature. As results of these treatments, hot-rolled sheets having a thickness of 20 mm were obtained. In this regard, as for No. 33, cracking occurred in the hot rolling, so that a hot-rolled sheet was not obtained and the steps thereafter were cancelled.

Both surfaces of the resulting hot-rolled sheet were cut by 1 mm so as to adjust the sheet thickness to be 18 mm, and cold rolling was performed at an appropriate reduction ratio (including 0%). Subsequently, Nos. 1 to 25, 34 to 43, and 47 to 48 were heated to a temperature of higher than 600° C. and 700° C. or lower at 0.5° C. to 10° C./min and Nos. 26 to 28 were heated to a temperature of higher than 500° C. and 600° C. or lower at 0.5° C. to 10° C./min. Holding for 5 to 20 hours was performed. After the holding for a predetermined time, Ni—Si dispersed particles were precipitated by cooling in the furnace. In this regard, as for Nos. 29 to 32, Ni—Si dispersed particles were precipitated by slow cooling after the hot rolling. Nos. 44 to 46 were not subjected to a precipitation treatment before the recrystallization treatment.

TABLE 1

Alloy composition (percent by mass)

| No. | | Cu | Ni | Si | Sn | Zn | Mg | Cr | Mn | S | Ni/Si |
|---|---|---|---|---|---|---|---|---|---|---|---|
| 1 | Example | remainder | 1.5 | 0.35 | 0.10 | 0.00 | 0.000 | 0.000 | 0.00 | 0.002 | 4.3 |
| 2 | | remainder | 1.8 | 0.40 | 0.10 | 0.00 | 0.000 | 0.000 | 0.00 | 0.002 | 4.5 |
| 3 | | remainder | 2.5 | 0.55 | 0.10 | 0.00 | 0.000 | 0.000 | 0.00 | 0.002 | 4.5 |
| 4 | | remainder | 3.6 | 0.80 | 0.10 | 0.00 | 0.000 | 0.000 | 0.00 | 0.002 | 4.5 |
| 5 | | remainder | 3.2 | 0.70 | 0.10 | 0.00 | 0.000 | 0.000 | 0.00 | 0.002 | 4.6 |
| 6 | | remainder | 3.2 | 0.64 | 0.10 | 0.00 | 0.000 | 0.000 | 0.00 | 0.002 | 5.0 |
| 7 | | remainder | 3.2 | 0.80 | 0.10 | 0.00 | 0.000 | 0.000 | 0.00 | 0.002 | 4.0 |
| 8 | | remainder | 3.2 | 0.70 | 0.01 | 0.00 | 0.000 | 0.000 | 0.00 | 0.002 | 4.6 |
| 9 | | remainder | 2.0 | 0.45 | 0.50 | 0.00 | 0.000 | 0.000 | 0.00 | 0.002 | 4.4 |
| 10 | | remainder | 2.5 | 0.55 | 1.30 | 0.00 | 0.000 | 0.000 | 0.00 | 0.002 | 4.5 |
| 11 | | remainder | 1.8 | 0.40 | 0.10 | 0.01 | 0.000 | 0.000 | 0.00 | 0.002 | 4.5 |
| 12 | | remainder | 2.7 | 0.60 | 0.10 | 0.10 | 0.000 | 0.000 | 0.00 | 0.002 | 4.5 |
| 13 | | remainder | 3.2 | 0.70 | 0.10 | 1.00 | 0.000 | 0.000 | 0.00 | 0.002 | 4.6 |
| 14 | | remainder | 2.5 | 0.55 | 0.10 | 5.00 | 0.000 | 0.000 | 0.00 | 0.002 | 4.5 |
| 15 | | remainder | 3.0 | 0.65 | 0.10 | 0.00 | 0.005 | 0.000 | 0.00 | 0.002 | 4.6 |
| 16 | | remainder | 1.8 | 0.40 | 0.10 | 0.00 | 0.050 | 0.000 | 0.00 | 0.002 | 4.5 |
| 17 | | remainder | 2.0 | 0.45 | 0.10 | 0.00 | 0.200 | 0.000 | 0.00 | 0.002 | 4.4 |
| 18 | | remainder | 2.5 | 0.55 | 0.10 | 0.00 | 0.000 | 0.001 | 0.00 | 0.002 | 4.5 |
| 19 | | remainder | 2.3 | 0.50 | 0.10 | 0.00 | 0.000 | 0.030 | 0.00 | 0.002 | 4.6 |
| 20 | | remainder | 2.7 | 0.60 | 0.10 | 0.00 | 0.000 | 0.300 | 0.00 | 0.002 | 4.5 |
| 21 | | remainder | 3.2 | 0.70 | 0.10 | 0.00 | 0.000 | 0.000 | 0.01 | 0.002 | 4.6 |
| 22 | | remainder | 3.0 | 0.65 | 0.10 | 0.00 | 0.000 | 0.000 | 0.10 | 0.002 | 4.6 |
| 23 | | remainder | 2.7 | 0.60 | 0.10 | 0.10 | 0.000 | 0.000 | 0.00 | 0.02 | 4.5 |
| 24 | | remainder | 1.8 | 0.40 | 0.10 | 0.00 | 0.000 | 0.000 | 0.50 | 0.002 | 4.5 |
| 25 | | remainder | 2.5 | 0.55 | 0.10 | 1.00 | 0.050 | 0.030 | 0.10 | 0.002 | 4.5 |
| 26 | | remainder | 2.7 | 0.60 | 0.10 | 0.10 | 0.000 | 0.000 | 0.00 | 0.002 | 4.5 |
| 27 | | remainder | 2.5 | 0.55 | 0.10 | 0.00 | 0.000 | 0.000 | 0.00 | 0.002 | 4.5 |
| 28 | | remainder | 3.0 | 0.65 | 0.10 | 0.00 | 0.005 | 0.000 | 0.00 | 0.002 | 4.6 |
| 29 | | remainder | 1.8 | 0.40 | 0.10 | 0.00 | 0.000 | 0.000 | 0.00 | 0.002 | 4.5 |
| 30 | | remainder | 3.2 | 0.70 | 0.10 | 0.00 | 0.000 | 0.000 | 0.00 | 0.002 | 4.6 |
| 31 | | remainder | 2.0 | 0.45 | 0.50 | 0.00 | 0.000 | 0.000 | 0.00 | 0.002 | 4.4 |
| 32 | | remainder | 2.5 | 0.55 | 0.10 | 0.00 | 0.000 | 0.001 | 0.00 | 0.002 | 4.5 |

TABLE 2

Alloy composition (percent by mass)

| No. | | Cu | Ni | Si | Sn | Zn | Mg | Cr | Mn | S | Ni/Si |
|---|---|---|---|---|---|---|---|---|---|---|---|
| 33 | Comparative | remainder | 4.5* | 1.00 | 0.10 | 0.00 | 0.000 | 0.000 | 0.00 | 0.002 | 4.5 |
| 34 | example | remainder | 1.2* | 0.25 | 0.10 | 0.00 | 0.000 | 0.000 | 0.00 | 0.002 | 4.8 |
| 35 | | remainder | 3.2 | 1.00 | 0.10 | 0.00 | 0.000 | 0.000 | 0.00 | 0.002 | 3.2* |
| 36 | | remainder | 3.2 | 0.60 | 0.10 | 0.00 | 0.000 | 0.000 | 0.00 | 0.002 | 5.3* |
| 37 | | remainder | 1.8 | 0.40 | 0.00* | 0.00 | 0.000 | 0.000 | 0.00 | 0.002 | 4.5 |
| 38 | | remainder | 3.0 | 0.65 | 1.50* | 0.00 | 0.000 | 0.000 | 0.00 | 0.002 | 4.6 |
| 39 | | remainder | 2.5 | 0.55 | 0.10 | 8.00* | 0.000 | 0.000 | 0.00 | 0.002 | 4.5 |
| 40 | | remainder | 2.3 | 0.50 | 0.10 | 0.00 | 0.300* | 0.000 | 0.00 | 0.002 | 4.6 |
| 41 | | remainder | 2.7 | 0.60 | 0.10 | 0.00 | 0.000 | 0.500* | 0.00 | 0.002 | 4.5 |
| 42 | | remainder | 3.2 | 0.70 | 0.10 | 0.00 | 0.000 | 0.000 | 1.00* | 0.002 | 4.6 |
| 43 | | remainder | 1.8 | 0.40 | 0.10 | 0.00 | 0.010 | 0.000 | 0.00 | 0.03* | 4.5 |
| 44 | | remainder | 2.3 | 0.50 | 0.10 | 0.00 | 0.000 | 0.030 | 0.00 | 0.002 | 4.6 |
| 45 | | remainder | 2.7 | 0.60 | 0.10 | 0.10 | 0.000 | 0.000 | 0.00 | 0.002 | 4.5 |
| 46 | | remainder | 3.2 | 0.70 | 0.10 | 0.00 | 0.000 | 0.000 | 0.00 | 0.002 | 4.6 |
| 47 | | remainder | 2.7 | 0.60 | 0.10 | 0.10 | 0.000 | 0.000 | 0.00 | 0.002 | 4.5 |
| 48 | | remainder | 2.7 | 0.60 | 0.10 | 0.10 | 0.000 | 0.000 | 0.00 | 0.002 | 4.5 |
| 49 | | remainder | 1.8 | 0.40 | 0.10 | 1.10 | 0.020 | 0.000 | 0.02 | 0.002 | 4.5 |
| 50 | | remainder | 3.2 | 0.70 | 0.00* | 0.00 | 0.000 | 0.020 | 0.00 | 0.002 | 4.6 |

*asterisked values are out of the specification of the present invention

After an oxide film of the sheet was removed with emery paper, cold rolling was performed so as to adjust the sheet thickness to be 0.3 to 0.2 mm.

Subsequently, Nos. 1 to 32, 34 to 46, 49, and 50 were held at a temperature of 700° C. to 900° C. for within the range of 5 to 300 seconds, No. 47 was held at a temperature of lower than 700° C. for within the range of 5 to 300 seconds, and No. 48 was held at a temperature of higher than 900° C. for within the range of 5 to 300 seconds. Thereafter, recrystallization treatment accompanied by a solution treatment was performed by quenching in water.

Final cold working was performed so as to obtain a material having a sheet thickness of 0.15 mm, and a precipitation treatment was performed at 430° C. to 480° C. for 2 hours.

Specimens were cut from the copper alloy sheets of Nos. 1 to 32 and 34 to 50 produced by the above-described steps, and a 0.2% proof stress measurement on the basis of a tensile test, an electrical conductivity measurement, a W-bending test, observation and measurement of the crystal structure, observation and measurement of dispersed particles, and stress relaxation resistance examination were performed in the following manners. The results thereof are shown in Tables 3 and 4.

<Tensile Test>

A JIS No. 5 specimen in which the rolling direction was a longitudinal direction was used, and a tensile test in conformity with JIS Z2241 was performed so as to determine the 0.2% proof stress. In examples at that time, a 0.2% proof stress of 550 N/mm$^2$ or more was accepted.

<Electrical Conductivity Measurement>

A specimen 10 mm wide by 300 mm long, in which the rolling direction was a longitudinal direction, was used, the electric resistance was measured with a double bridge type electric resistance measuring apparatus in conformity with the measuring method for electrical conductivity of non-ferrous materials described in JIS H0505, and the electrical conductivity was calculated by an average cross-sectional area method. In examples at that time, an electrical conductivity of 35% IACS or more was accepted.

<W-Bending Test>

Specimens 10 mm wide by 30 mm long, in which L. D. (parallel to the rolling direction) or T.D. (perpendicular to the rolling direction) was a longitudinal direction, were used, and the W-bending test was performed, where bending radius R was specified to be 0.05 mm, in conformity with the W-bending test described in JCBA T307. After the W-bending test, an observation surface in a direction perpendicular to a bending axis was obtained by using a cold embedding resin, finish polishing was performed with No. 2400 count waterproof abrasive paper and a buff coated with 1-μm diamond spray. In addition, crystal grain boundaries were corroded with chromic acid and ferric chloride and, thereby, an observation sample was obtained. A bending vertex of the observation sample was observed, and presence or absence of cracking and the form of cracking of each of the three samples were examined. The case where cracking was not observed was evaluated as ○ (acceptable) and the case where cracking was observed was evaluated as x (not acceptable).

<Measurement of Average Crystal Grain Size>

An observation surface defined by a rolling direction and a sheet thickness direction was obtained by using a cold embedding resin and, thereafter, finish polishing was performed with No. 2400 count waterproof abrasive paper and a buff coated with 1-μm diamond spray. In addition, crystal grain boundaries were corroded with chromic acid and ferric chloride and, thereby, an observation sample was obtained. An optical microscope was used for structural observation and a structural photograph was obtained under a magnification of 400 times. A cutting method was used for measuring the average crystal grain size, four lines, each having a length of 250 μm, were drawn on the structural photograph, where the direction of the line was specified to be a direction parallel to the rolling direction, and an arithmetic average of crystal grain sizes determined with respect to the respective lines was specified to be an average crystal grain size.

<Measurement of Standard Deviation of Crystal Grain Size>

A field emission scanning electron microscope equipped with a backscattered electron diffraction image system produced by TSL was used, and the measurement was performed by a crystal orientation analysis method. Electron beams were applied to a measurement area of 100 by 100 μm in steps of 0.4 μm, and a crystal orientation difference of 15° or more was considered as a crystal grain boundary. An area of each crystal grain in the area was measured, and the equivalent circle diameter thereof was considered as the crystal grain size. The standard deviation a of the crystal grain size was determined on the basis of the following Formula (1), where the number of measured crystal grains was specified to be n and the individual crystal grain sizes were specified to be Da (a=1, 2, 3, . . . , n).

$$\sigma = \frac{\sqrt{\sum_{a=1}^{n}\left(D_a - \frac{\sum_{a=1}^{n} D_a}{n}\right)^2}}{n-1} \tag{1}$$

<Observation of Dispersed Particles>

A cross section defined by the rolling direction and the sheet thickness direction was produced by ion milling, and observation was performed by using the field emission scanning electron microscope under a magnification of 15,000 times. The number of dispersed particles of 30 to 300 nm in a region of 100 μm$^2$ of each sample was measured. The diameters and frequencies of appearance thereof were examined, and among the dispersed particles having a diameter of 30 to 300 nm, the proportion of the number of particles having a particle diameter of 90 to 300 nm and the proportion of the number of particles having a particle diameter of 120 to 300 nm were determined. In the present invention, the particle diameter of the dispersed particle refers to a major axis (maximum length) of the particle.

<Stress Relaxation Resistance Measurement>

The measurement of the stress relaxation resistance was performed by a cantilever system in conformity with the Electronic Materials Manufacturers Association Standard EMAS01011. A strip specimen 10 mm wide by 60 mm long, in which a longitudinal direction was a direction perpendicular to the rolling direction, was used.

The above-described specimen was used. The specimen was fixed to a jig, where the span length was set in such a way that the load stress became 80% of the 0.2% proof stress on the basis of Formula (2) described below.

$$d=0.8 \times \sigma_{0.2} \times l^2/(1.5 \times E \times t) \tag{2}$$

where d: initial set (mm), $\sigma_{0.2}$: proof stress (N/mm$^2$), l: span length (mm), E: deflection factor (N/mm$^2$), and t: sheet thickness (mm).

The specimen in the state of being fixed to the jig was heated in an oven at 150° C. for 1,000 hours. After the heating, the load stress was removed from the specimen, the deflection δ (mm) after removal of the load stress was measured, and the stress relaxation ratio RS (%) was calculated on the basis of Formula (3) described below. In examples at that time, a stress relaxation ratio of 15% or less was accepted.

$$RS=100 \times \delta/d \tag{3}$$

As shown in Tables 3 and 4, Nos. 1 to 32, in which the alloy composition, the average crystal grain size, the standard deviation of the crystal grain size, and the particle diameter distribution of Ni—Si dispersed particles satisfied the specifications according to the present invention, were superior in all the 0.2% proof stress, the electrical conductivity, the bending workability, and the stress relaxation resistance. The number of dispersed particles having a particle diameter of 30 to 300 nm of each of Nos. 1 to 32 was within the range of 50 to 100 in 100 μm$^2$.

Meanwhile, as for Nos. 33 to 43 in which the alloy composition did not satisfy the specification according to the present invention and Nos. 44 to 50 in which at least one of the average crystal grain size, the standard deviation of the crystal grain size, and the particle diameter distribution of Ni—Si dispersed particles did not satisfy the specifications according to the present invention, at least one characteristic of the 0.2% proof stress, the electrical conductivity, the bending workability, and the stress relaxation resistance was poor.

Specifically, No. 33 had an excessive Ni content, and cracking occurred in hot rolling, so that it was not possible to produce a specimen. No. 34 had a small 0.2% proof stress because the Ni content were too small. No. 35 had a small Ni/Si ratio, No. 36 had a high Ni/Si ratio, and both had low electrical conductivity. No. 37 did not contain Sn, and the stress relaxation ratio was high. Nos. 38, 40, and 41 contained excessive Sn, Mg, and Cr, respectively, and all had low electrical conductivity and poor bending workability. No. 39 contained excessive Zn, the electrical conductivity was low, and the stress relaxation ratio was high. No. 42 contained excessive Mn, and the electrical conductivity was low. No. 43 contained excessive S which was an incidental impurity, the bending workability was poor, and the stress relaxation ratio was high.

TABLE 3

| No. | | Average crystal grain size [μm] | Standard deviation 2σ [μm] | Proportion of dispersed particles 90-300 nm [%] | Proportion of dispersed particles 120-300 nm [%] | 0.2% Proof stress [Mpa] | Electrical conductivity [% IACS] | W-bending test L.D. | W-bending test T.D. | Stress relaxation resistance [%] |
|---|---|---|---|---|---|---|---|---|---|---|
| 1 | Example | 12 | 8.0 | 85 | 60 | 560 | 45 | ○ | ○ | 15 |
| 2 | | 10 | 7.0 | 83 | 60 | 580 | 44 | ○ | ○ | 14 |
| 3 | | 15 | 7.5 | 75 | 50 | 650 | 40 | ○ | ○ | 14 |
| 4 | | 13 | 7.0 | 70 | 44 | 710 | 39 | ○ | ○ | 13 |
| 5 | | 12 | 7.0 | 78 | 50 | 700 | 40 | ○ | ○ | 13 |
| 6 | | 11 | 6.5 | 75 | 45 | 690 | 37 | ○ | ○ | 13 |
| 7 | | 17 | 8.2 | 80 | 55 | 710 | 37 | ○ | ○ | 13 |
| 8 | | 17 | 8.0 | 80 | 50 | 680 | 42 | ○ | ○ | 15 |
| 9 | | 10 | 6.5 | 76 | 48 | 640 | 38 | ○ | ○ | 12 |
| 10 | | 7 | 6.0 | 81 | 52 | 700 | 35 | ○ | ○ | 10 |
| 11 | | 15 | 7.2 | 82 | 51 | 580 | 43 | ○ | ○ | 14 |
| 12 | | 15 | 7.5 | 84 | 55 | 660 | 40 | ○ | ○ | 14 |
| 13 | | 14 | 7.7 | 77 | 50 | 700 | 38 | ○ | ○ | 14 |
| 14 | | 16 | 8.0 | 75 | 45 | 640 | 36 | ○ | ○ | 15 |
| 15 | | 15 | 7.6 | 81 | 53 | 680 | 40 | ○ | ○ | 13 |
| 16 | | 13 | 7.0 | 76 | 48 | 600 | 38 | ○ | ○ | 11 |
| 17 | | 12 | 6.8 | 78 | 50 | 620 | 36 | ○ | ○ | 9 |
| 18 | | 15 | 7.0 | 80 | 52 | 650 | 40 | ○ | ○ | 14 |
| 19 | | 16 | 7.5 | 82 | 53 | 640 | 39 | ○ | ○ | 14 |
| 20 | | 13 | 7.0 | 86 | 60 | 680 | 37 | ○ | ○ | 14 |
| 21 | | 14 | 7.2 | 74 | 48 | 700 | 40 | ○ | ○ | 14 |
| 22 | | 13 | 7.0 | 70 | 45 | 680 | 39 | ○ | ○ | 13 |
| 23 | | 15 | 7.2 | 80 | 50 | 660 | 40 | ○ | ○ | 15 |
| 24 | | 15 | 8.0 | 78 | 50 | 590 | 37 | ○ | ○ | 12 |
| 25 | | 10 | 6.8 | 78 | 50 | 670 | 36 | ○ | ○ | 10 |
| 26 | | 9 | 7.0 | 23 | 12 | 630 | 40 | ○ | ○ | 15 |
| 27 | | 9 | 7.5 | 50 | 29 | 630 | 40 | ○ | ○ | 15 |
| 28 | | 8 | 6.8 | 65 | 35 | 660 | 40 | ○ | ○ | 14 |
| 29 | | 13 | 8.0 | 85 | 65 | 570 | 44 | ○ | ○ | 12 |
| 30 | | 14 | 8.5 | 80 | 60 | 680 | 40 | ○ | ○ | 12 |
| 31 | | 12 | 7.2 | 82 | 59 | 620 | 39 | ○ | ○ | 11 |
| 32 | | 16 | 7.6 | 86 | 62 | 640 | 40 | ○ | ○ | 12 |

TABLE 4

| No. | | Average crystal grain size [μm] | Standard deviation 2σ [μm] | Proportion of dispersed particles 90-300 nm [%] | Proportion of dispersed particles 120-300 nm [%] | 0.2% Proof stress [Mpa] | Electrical conductivity [% IACS] | W-bending test L.D. | W-bending test T.D. | Stress relaxation resistance [%] |
|---|---|---|---|---|---|---|---|---|---|---|
| 33 | Comparative | | | occurrence of cracking | | | | | | |
| 34 | example | 15 | 7.0 | 77 | 50 | 520* | 45 | ○ | ○ | 16* |
| 35 | | 8 | 6.0 | 85 | 62 | 670 | 33* | ○ | ○ | 13 |
| 36 | | 16 | 6.6 | 83 | 54 | 690 | 33* | ○ | ○ | 13 |
| 37 | | 17 | 8.0 | 75 | 49 | 560 | 45 | ○ | ○ | 17* |
| 38 | | 6 | 6.0 | 78 | 50 | 750 | 33* | x | x | 9 |
| 39 | | 13 | 7.0 | 80 | 51 | 650 | 34* | ○ | ○ | 17* |
| 40 | | 10 | 6.7 | 76 | 48 | 680 | 34* | x | x | 8 |
| 41 | | 12 | 7.0 | 85 | 58 | 700 | 34* | x | x | 12 |
| 42 | | 15 | 8.0 | 82 | 53 | 720 | 33* | ○ | ○ | 12 |
| 43 | | 15 | 7.5 | 80 | 51 | 580 | 43 | x | x | 16* |
| 44 | | 10 | 13.0* | 10* | 4* | 680 | 39 | x | x | 14 |
| 45 | | 9 | 12.5* | 12* | 5* | 720 | 40 | x | x | 14 |
| 46 | | 7 | 12.1* | 15* | 7* | 730 | 40 | x | x | 13 |

TABLE 4-continued

| No. | Average crystal grain size [μm] | Standard deviation 2σ [μm] | Proportion of dispersed particles 90-300 nm [%] | Proportion of dispersed particles 120-300 nm [%] | 0.2% Proof stress [Mpa] | Electrical conductivity [% IACS] | W-bending test L.D. | W-bending test T.D. | Stress relaxation resistance [%] |
|---|---|---|---|---|---|---|---|---|---|
| 47 | 4* | 4.0 | 80 | 52 | 560 | 42 | ○ | ○ | 21* |
| 48 | 55* | 18.0* | measurement was impossible | | 700 | 37 | x | x | 10 |
| 49 | 3* | 4.2 | 13* | 7* | 560 | 44 | ○ | ○ | 20* |
| 50 | 4* | 4.5 | 17* | 10* | 720 | 50 | ○ | ○ | 22* |

*asterisked values are out of the specification of the present invention or inferior in characteristics As for each of Nos. 44 to 46 in which a precipitation treatment of Ni—Si dispersed particles was not performed before the recrystallization treatment accompanied by a solution treatment, the standard deviation of the crystal grain size was larger than that in the specification, the proportion of the number of particles having a particle diameter of 90 to 300 nm and the proportion of the number of particles having a particle diameter of 120 to 300 nm were small, and the bending workability was poor.

The temperature of recrystallization treatment accompanied by a solution treatment of No. 47 was too low. Therefore, the average crystal grain size was smaller than that in the specification, and the stress relaxation ratio was high. The temperature of recrystallization treatment accompanied by a solution treatment of No. 48 was too high. Therefore, the average crystal grain size and the standard deviation of the crystal grain size were larger than those in the specification, dispersed particles of 30 to 300 nm were not observed, and the bending workability was poor. In No. 48, intergranular cracking occurred.

The method described in Japanese Patent Application Publication No. 2008-196042 was applied to Nos. 49 and 50. The proportion of the number of particles having a particle diameter of 90 to 300 nm and the proportion of the number of particles having a particle diameter of 120 to 300 nm were small, the average crystal grain size was smaller than that in the specification, and the stress relaxation ratio was high.

What is claimed is:

1. A copper alloy sheet, comprising:
   Cu;
   1.5 to 4.0 percent by mass of Ni;
   Si satisfying a Ni/Si mass ratio of 4.0 to 5.0; and
   0.01 to 1.3 percent by mass of Sn,
   wherein
   the copper alloy sheet has an average crystal grain size of more than 10 μm and 20 μm or less,
   a standard deviation of crystal grain size satisfies 2σ<10 μm, and
   among Ni—Si dispersed particles having a particle diameter of 30 to 300 nm, a proportion of Ni—Si dispersed particles having a particle diameter of 90 to 300 nm is 20% or more when the particles are observed in a cross-section defined by a direction perpendicular to a sheet surface and a direction parallel to a rolling direction.

2. The copper alloy sheet according to claim 1, wherein among the Ni—Si dispersed particles having a particle diameter of 30 to 300 nm, a proportion of Ni—Si dispersed particles having a particle diameter of 120 to 300 nm is 30% or more when the particles are observed in the cross-section.

3. The copper alloy sheet according to claim 1, wherein the average crystal grain size is 11 μm or more and 20 μm or less.

4. The copper alloy sheet according to claim 1, further comprising:
   0.005 to 0.2 percent by mass of Mg.

5. The copper alloy sheet according to claim 1, further comprising:
   0.01 to 5.0 percent by mass of Zn.

6. The copper alloy sheet according to claim 1, further comprising:
   at least one of 0.01 to 0.5 percent by mass of Mn and 0.001 to 0.3 percent by mass of Cr.

7. The copper alloy sheet according to claim 1, further comprising:
   0.02 percent by mass or less of S.

8. The copper alloy sheet according to claim 4, further comprising:
   0.01 to 5.0 percent by mass of Zn.

9. The copper alloy sheet according to claim 4, further comprising:
   at least one of 0.01 to 0.5 percent by mass of Mn and 0.001 to 0.3 percent by mass of Cr.

10. The copper alloy sheet according to claim 5, further comprising:
    at least one of 0.01 to 0.5 percent by mass of Mn and 0.001 to 0.3 percent by mass of Cr.

11. The copper alloy sheet according to claim 4, further comprising:
    0.02 percent by mass or less of S.

12. The copper alloy sheet according to claim 5, further comprising:
    0.02 percent by mass or less of S.

13. The copper alloy sheet according to claim 6, further comprising:
    0.02 percent by mass or less of S.

14. The copper alloy sheet according to claim 1, which is suitable for an electric part.

15. The copper alloy sheet according to claim 1, which is suitable for an electronic part.

* * * * *